United States Patent [19]
Morlon

[11] Patent Number: 5,111,205
[45] Date of Patent: May 5, 1992

[54] DIGITAL-TO-ANALOG AND ANALOG-TO-DIGITAL CONVERTERS

[75] Inventor: Patrice P. Morlon, Valbonne, France

[73] Assignee: VLSI Technology, Inc., San Jose, Calif.

[21] Appl. No.: 629,530

[22] Filed: Dec. 18, 1990

[51] Int. Cl.⁵ .................. H03M 1/68; H03M 1/78; H03M 1/06; H03M 1/14

[52] U.S. Cl. .................. 341/156; 341/145; 341/154; 341/159; 341/118

[58] Field of Search ............... 341/156, 118, 145, 154, 341/159, 126, 135

[56] References Cited

U.S. PATENT DOCUMENTS

| | | |
|---|---|---|
| 3,597,761 | 8/1971 | Fraschilla .................. 341/156 |
| 4,008,468 | 2/1977 | Imhoff et al. .................. 341/156 |
| 4,099,173 | 7/1978 | Zeskind et al. .................. 341/156 X |
| 4,353,059 | 10/1982 | Vaitkus .................. 341/156 |
| 4,491,825 | 1/1985 | Tuthill .................. 341/118 X |

Primary Examiner—Sharon D. Logan
Attorney, Agent, or Firm—Bowles Horton

[57] ABSTRACT

An architecture for a digital-to-analog converter or an analog-to-digital converter comprises a segmented voltage divider comprising a first resistive voltage divider providing a multiplicity of equal selectable voltage segments any one of which may be coupled directly across a second resistive voltage divider. The loading of the first resistive voltage divider by the second voltage divider is compensated by means of a controlled current source which responds to one of the voltage segments to provide a current which may be coupled by way of current mirrors in parallel with the second voltage divider.

8 Claims, 8 Drawing Sheets

DIGITAL-TO-ANALOG AND ANALOG-TO-DIGITAL CONVERTERS

FIELD OF THE INVENTION

This invention relates to converters, that is to say both digital-to-analog and analog-to-digital converters and particularly to such converters which employ a segmented or dual architecture including at least two resistive voltage dividers arranged in cascade. The invention is intended to be suitable for realisation in CMOS technology but is not intended to be limited thereto.

BACKGROUND TO THE INVENTION

It is known in the art to provide a segmented or dual digital-to-analog converter wherein a resistive voltage divider provides a coarse conversion by means of switches controlled by a decoder from the more significant bits of a digital signal and a further, fine voltage divider provides a fine conversion in response to the less significant bits of the digital signal. The use of a coarse (M-bit) converter cascaded with a fine (L-bit) converter instead of a N-bit converter (wherein $N=M+L$) produces a very great saving in the number of devices which are required for the conversion and accordingly a very great saving in the area of the converter. Usually a N-bit converter requires $2^N$ accurate devices whereas a cascaded converter needs only $(2^M + 2^L)$ such devices.

Post et al., in ESSCIRC 82, pages 69 to 72, describe a 14 bit monotonic NMOS digital-to-analog converter in which two ladder networks are arranged in cascade to provide segmented digital-to-analog conversion of the general kind described above.

Another form of segmented CMOS digital to analog converter is described in a paper by M Tuthill, Analog Devices B. V. of Limerick, Ireland (date unknown). This describes a segmented converter in which the nodes of a resistive voltage divider are connectable via respective switches to two voltage rails, alternate nodes being connectable to respective rails, and the voltage segment obtained thereby is coupled by means of buffer amplifiers to an R/2R digital-to-analog converter.

Dingwall et al., in IEEE Journal of Solid State Circuits, Volume SC-20, No. 6, December 1985, describe an intermeshed ladder network in which a coarse ladder and a multiplicity of fine ladders are used to provide two-stage analog-to-digital conversion.

Cascaded ladder networks are also proposed for use in an analog-to-digital converter by Grant et al., IEEE Journal of Solid State Circuits, Volume SC-22, No. 2, April 1987. This paper describes the use of a coarse ladder network which is connected through buffer amplifiers to a fine ladder network both of which are arranged in association with a multiplicity of comparators to form a two-stage 'flash' converter.

The main problem which arises from the use of a segmented converter is that if the fine converter is connected directly to the preceding relatively coarse converter, it will sink current which would otherwise flow through the coarse converter. This sinking of current affects the linearity of the conversion. The Post et al reference mentioned above illustrates a realisation in which there is no interface between the coarse and fine ladders. However, although the realisation provides monotonicity of the transfer curve, the integral linearity is poor.

Consequently, as described in the Grant et al., and Tuthill references, an interface is employed between the ladder networks. This interface normally comprises an operational amplifier configured as a buffer. As is well known, an operational amplifier has, effectively, an infinite input impedance and does not sink current, that is to say does not load the network to which the input is connected. However, there are two main drawbacks to the provision of such an interface. The response of an operational amplifier, and particularly a CMOS operational amplifier, is very slow compared to the settling time of a resister converter and tends to have, since the amplifier normally needs to be directly coupled, a large offset which affects the linearity of conversion. The Tuthill reference noted above describes a technique which tries to avoid any degradation of the monotonic response due to the offset but the technique does not preserve integral linearity.

Accordingly, it is an object of the present invention to provide an improved cascaded resistive network for use in digital-to-analog or analog-to-digital conversion.

It is a further or alternative object of the invention to provide an improved converter which does not require an interface between resistive ladder networks.

It is a further or alternative object of the invention to provided a segmented converter which is particularly suitable for realisation in CMOS technology.

Broadly speaking, the above objects may be attained by the provision of a current source which compensates for the sinking of current by the relatively fine divider. Such a current source may be coupled to lines which convey the voltage segment from the coarse divider to the fine divider and may be realised by a circuit which responds to a voltage developed across a part of the coarse voltage divider and includes means for comparing such a voltage with a current developed across a resistance corresponding to the resistance of the fine voltage divider to provide a controlled current generator which may coupled, for example by current mirrors, to the lines that connect a voltage segment to the fine divider.

Other objects and advantages of the invention will be apparent from a consideration of the following detailed description with reference to the drawings.

BRIEF DESCRIPTION OF THE ACCOMPANYING DRAWINGS

DETAILED DESCRIPTION OF THE PREFERRED EMBODIMENTS

Figure 1:
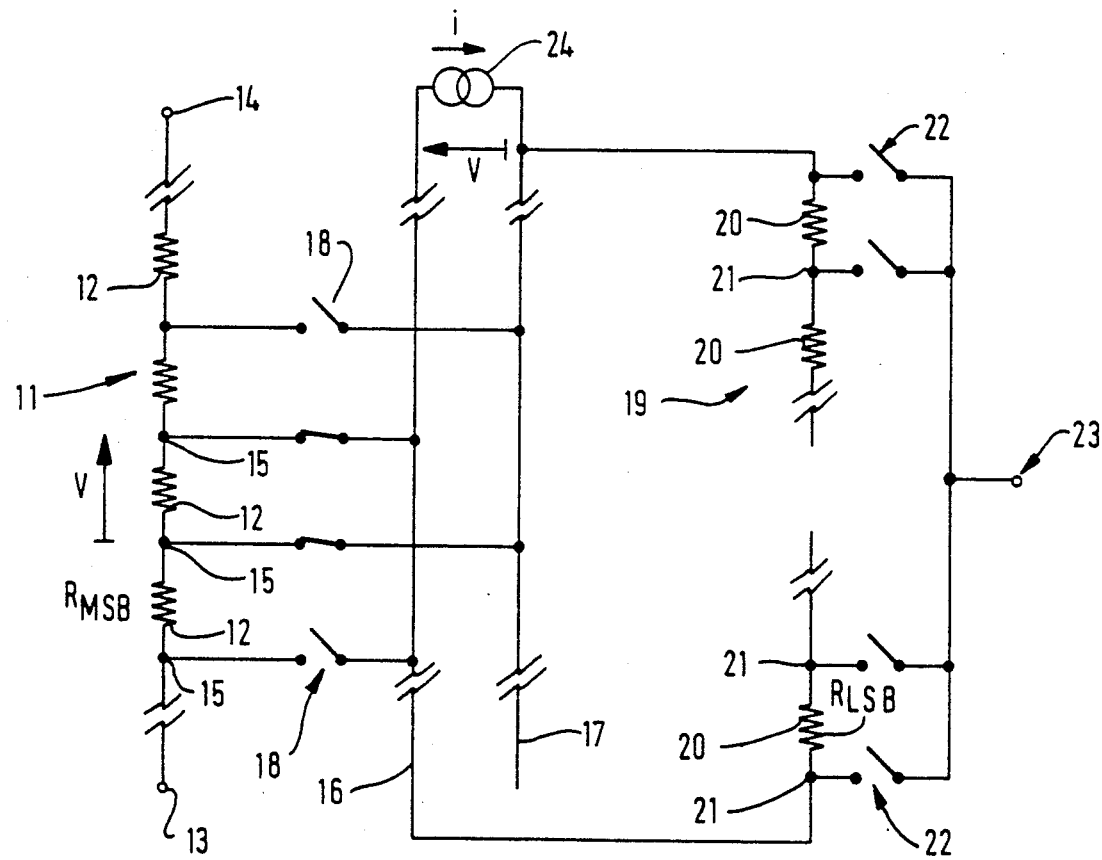
FIG. 1 is a schematic diagram of two cascaded resistive dividers according to the invention.

FIG. 1 illustrates the principal parts, excluding the external control by means of a digital word, of a digitalto-analog converter which includes two cascaded resistive voltage dividers which are arranged to provide, in conjunction with control switches, segmented digital-to-analog conversion. The main basis of the converter is to provide by means of a coarse voltage divider a voltage segment, that is to say two voltages which are above and below, according to the limits of resolution of the coarse divider, the voltage corresponding to the full resolution of the controlling digital word and to feed this voltage segment to a fine voltage divider which is controlled by the less significant bits of the digital word to provide the required interpolation between the two voltages defining the voltage segment.

The converter shown in FIG. 1 therefore includes a first voltage divider 11 which is composed of a plurality of resistors, preferably substantially equal resistors 12 disposed in a chain between two reference terminals 13 and 14, which are connected to reference sources of potential. Only part of the divider chain is shown for the purposes of explanation. The resistors 11 define between them nodes 15 which are the taps of the divider. Each of these nodes is (in the simplified embodiment shown in FIG. 1) connected to one or other of two lines 16 and 17 by means of a respective switch 18. More complex arrays of switches may be used in practice, to the same effect. It is preferable, for reasons which will become apparent, to connect alternate nodes, if the corresponding switches 18 are closed, to alternate lines.

The two lines 16 and 17 are connected by a fine resistive divider 19 which is composed of a multiplicity of resistors 20 defining between them a plurality of nodes 21, each connected by means of a respective switch 22 to an output terminal 23.

It may be remarked that it is possible, as explained later, to have a cascade of more than two resistive voltage dividers and so instead of the connection of the nodes of the second divider 19 to an output terminal, it is possible to connect the nodes 21 to another divider in the same way as the nodes of the first divider are connected to the divider 20. However, essentially the same principles of operation will apply.

The arrangement as thus far described resembles the circuit described in the Post et al. reference mentioned above. The switches 18 are controlled so that two consecutive nodes are connected to the voltage lines 16 and 17 in accordance with the top or most significant bits of the controlling digital word. Thus the lines 16 and 17 are coupled to two potentials which define a voltage segment spanning the required value. Normally if there are M bits controlling the switches 18 there will be $2^M$ resistors and $2^M$ different voltage segments. The switches 22 are controlled so that the appropriate one of them connects a respective voltage node to the terminal 23 in accordance with the bottom or less significant bits of the controlling digital word so as to divide the voltage segment and provide at the terminal 23 a voltage (relative to some selected datum) which represents a digital-to-analog conversion of the controlling digital word with the full resolution provided by all the bits of the digital word. The external device connected to the terminal 23 should have a high input impedance.

This arrangement is inherently monotonic but suffers from poor linearity because the coarse divider is loaded with the finite impedance of the fine divider. Typically, if a CMOS implementation is employed, the resistors of the coarse divider and the fine divider may each be of the order of 200 ohms and the 'on' resistance of each of the CMOS switches 18 and 22 may be approximately 1 kilohm.

It may be noted that the sink current (i) is constant and is equal to a voltage (V) between any two consecutive nodes of the coarse ladder divided by the total resistance (RT) of the fine ladder. The present invention is based on the use of a current source which may be connected in parallel with the fine divider and provides a current which is substantially equal to the sink current flowing through the fine divider. This theoretically compensates for the linearity errors of the structure without prejudice to the speed of operation, the direct connection between the dividers being maintained.

Such a current source is shown schematically in FIG. 1 as a floating current generator 24 coupled between the lines 16 and 17.

Figure 2:
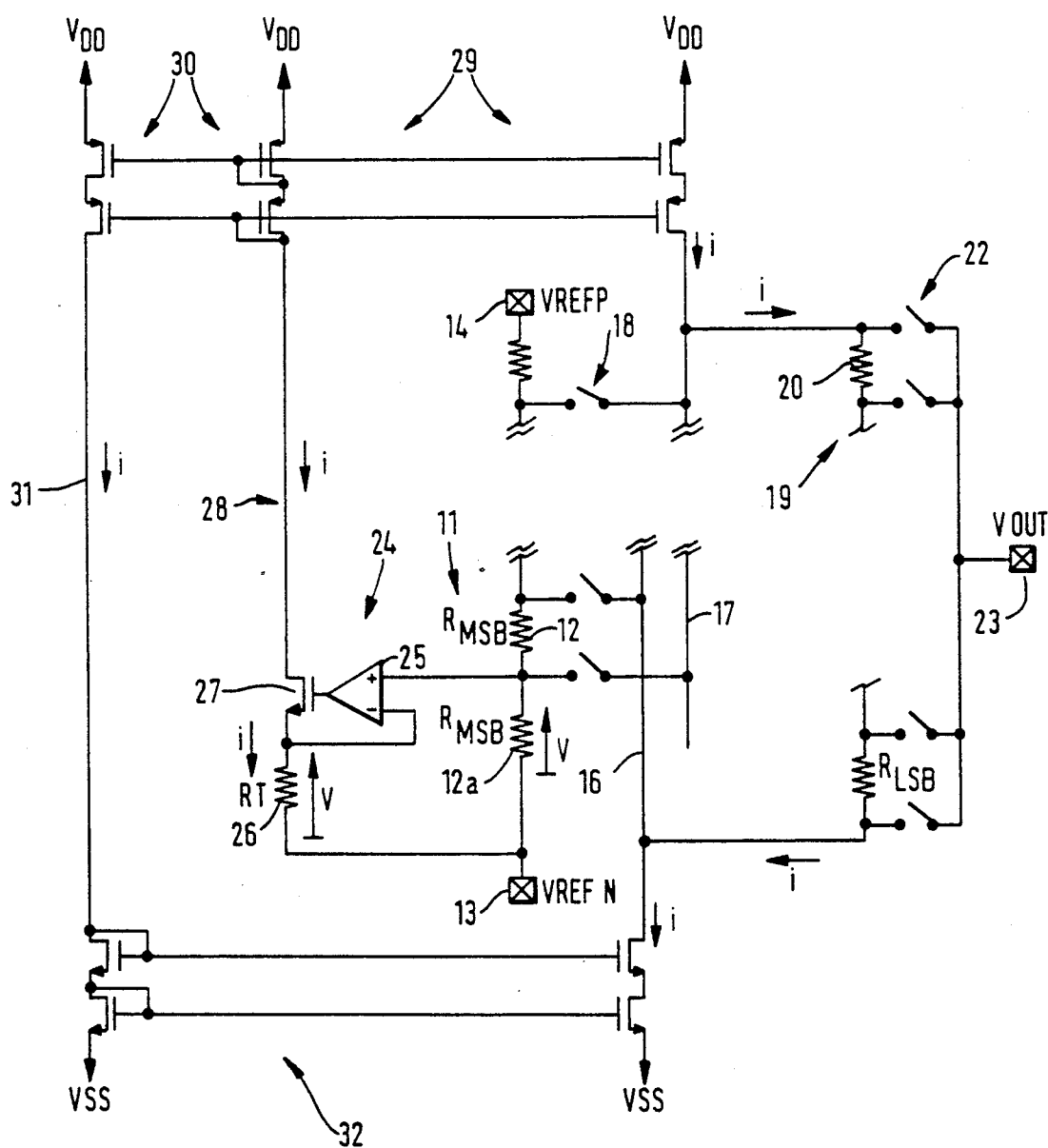
FIG. 2 illustrates one implementation of a tracking current source.

FIG. 2 illustrates one possible arrangement of the current source and the voltage dividers. Those parts of FIG. 2 which correspond to parts in FIG. 1 are, of course, shown with corresponding reference numerals.

In the arrangement shown in FIG. 2, the current generator 24 comprises an operational amplifier 25 arranged as a voltage current converter to compare a voltage developed across part of the coarse divider, and preferably across an resistor 12a at one end of the coarse divider, with a voltage developed by a current (i) flowing for the sake of stability through a resistor 26 which has a resistance (RT) corresponding to the total series resistance of the fine divider.

Accordingly the operational amplifier 25 has its non-inverting terminal connected to a first node at one end of the resistor 12a and its inverting terminal connected by way of the resistor 26 to the other end of the resistor 12a.

The output terminal of the operational amplifier 25 is connected to the gate of a field effect transistor 27 in series with the resistor 26. This arrangement provides a controlled current generator which drives the current (i) throughe resistor 26 such that the voltage drop i.RT across the resistor 26 is equal to the voltage across the resistor 12a.

The current (i) which is provided by the controlled current generator is coupled by cascode current mirrors to the lines 16 and 17 in parallel with the fine divider so as to compensate for the loading of the coarse divider by the fine divider. In particular, the line 28 which is connected to the transistor 27 is connected by way of double current mirror 29, 30 to the line 17 and to a line 31 which is connected by way of a second current mirror 32 to the line 16.

This preferred but not essential arrangement splits what would otherwise be a floating current source into two grounded current sources of opposite sign, such an arrangement being generally simpler to implement than a single floating current source.

Figure 3:
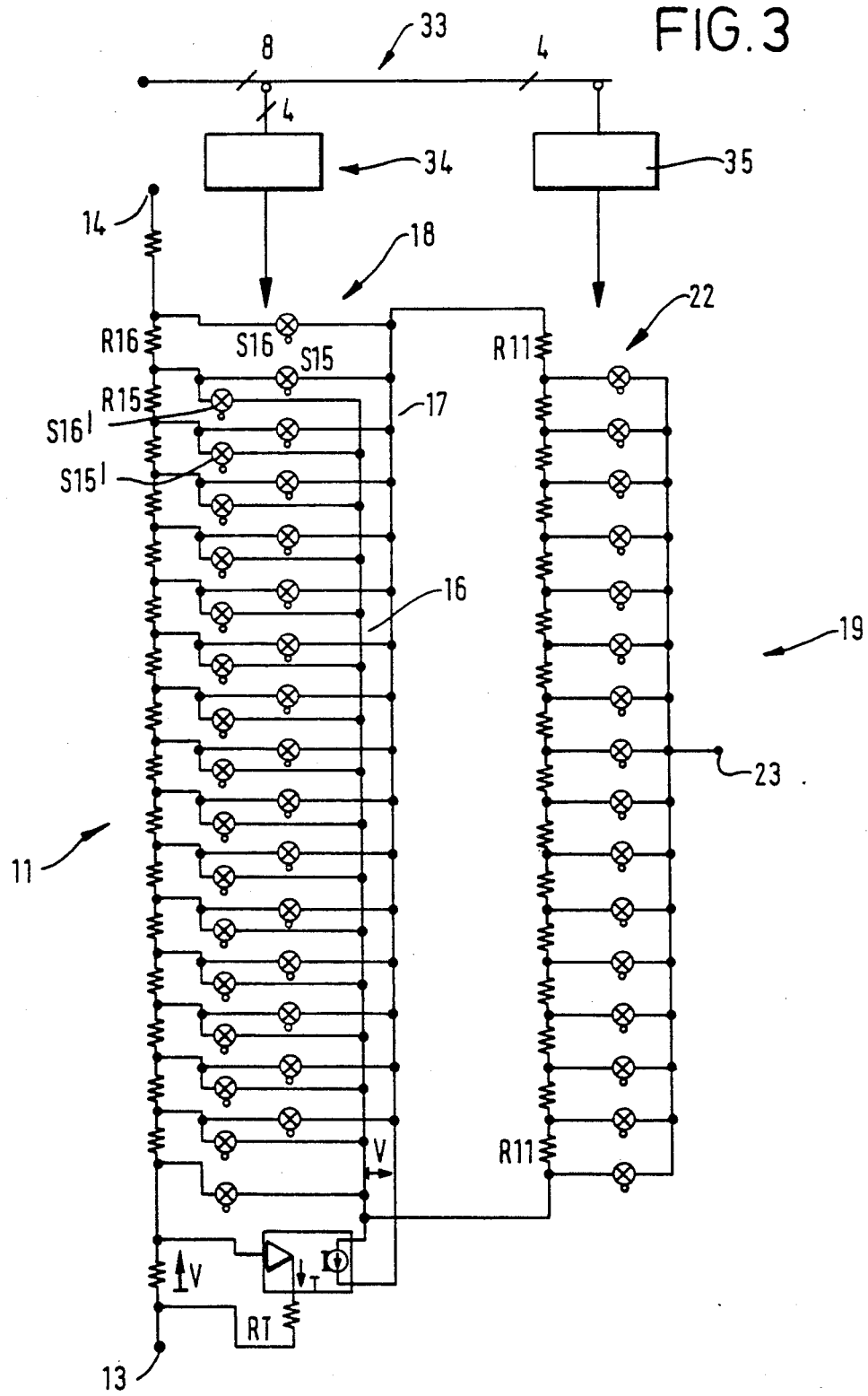
FIG. 3 illustrates schematically one embodiment of a digital-to-analog converter according to the invention.

FIG. 3 illustrates a particular embodiment of the invention including the arrangement of FIG. 1 and preferably including, though not shown in detail, a current source organised according to FIG. 2.

The arrangement shown in FIG. 3 includes the coarse divider and fine divider as previously described. An 8-bit digital input 33 is arranged so that the top 4 bits control a first decoder 34 which controls the switches 18 between the coarse divider and the voltage lines 16 and 17. A less significant bit decoder responds 35 to the bottom four bits of the digital input and controls the switches 22 between the fine divider and the output voltage terminal 23.

A feature of the arrangement shown in this figure is that there are two switches for each of the resistors in the coarse divider. The topmost and the lowermost node are connected each to a respective one of the lines 16 or 17 but each intermediate node is connected by a respective one of a pair of switches to a respective one of the line 16 and 17. Thus, for example, if the top segment (shown as R16) is to provide the voltage segment across the lines 16 and 17, the switch S16 connected to the topmost node and the switch S16' primed connected to the node immediately below the resistor R16 are closed. If the segment provided by resistor R15 is to be connected across the lines 16 and 17, then the switches S15 and S15' (connected to the nodes above and below resistor R15) are closed. The purpose of this arrangement is to ensure that any selected voltage segment is provided always with the same polarity across the lines 16 and 17.

The remainder of this figure is arranged as previously described with reference to the corresponding parts of FIGS. 1 and 2 and does not require further description.

Figure 4:
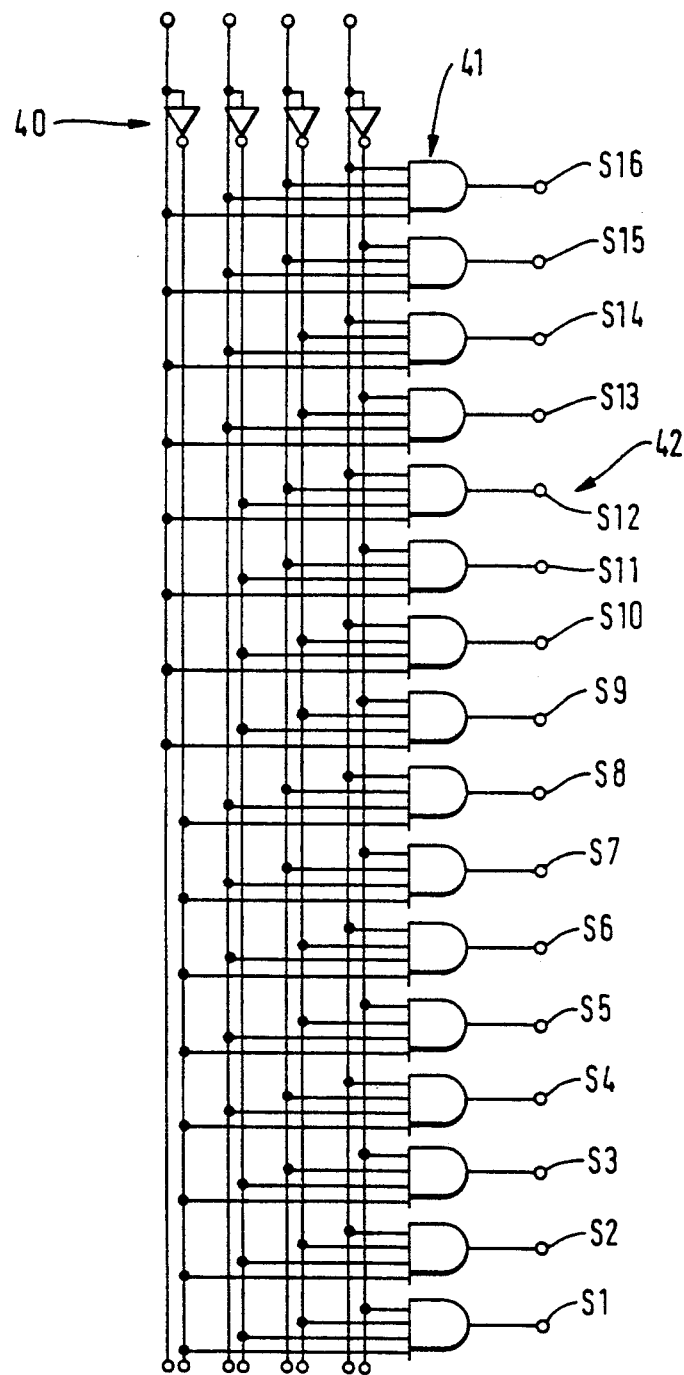
FIG. 4 illustrates a decoder which may be employed in the embodiment shown in FIG. 3.

FIG. 4 illustrates a decoder for use with the arrangement of the preceding figure. The decoders are similar and only the decoder 35 for the four least significant bits need be described.

The bit lines i0 to i3 are each connected by way of a respective one of four inverters 40 to auxiliary bit lines. An array 41 of AND gates are connected to the bit lines so as to energise a particular one of the sixteen output terminals S1 to S16 according to the bit state on the four bit lines.

For the control of the coarse decoder, each of the output terminals shown in this figure would be connected to the control terminals of the two relevant switches. For example, the output terminal S16 would be connected to switches S16 and S16' for the coarse array. In the decoder for the fine array, each output terminal may be connected to control a respective one of these switches 22 between the nodes 21 and the output terminal 23.

Figure 5:
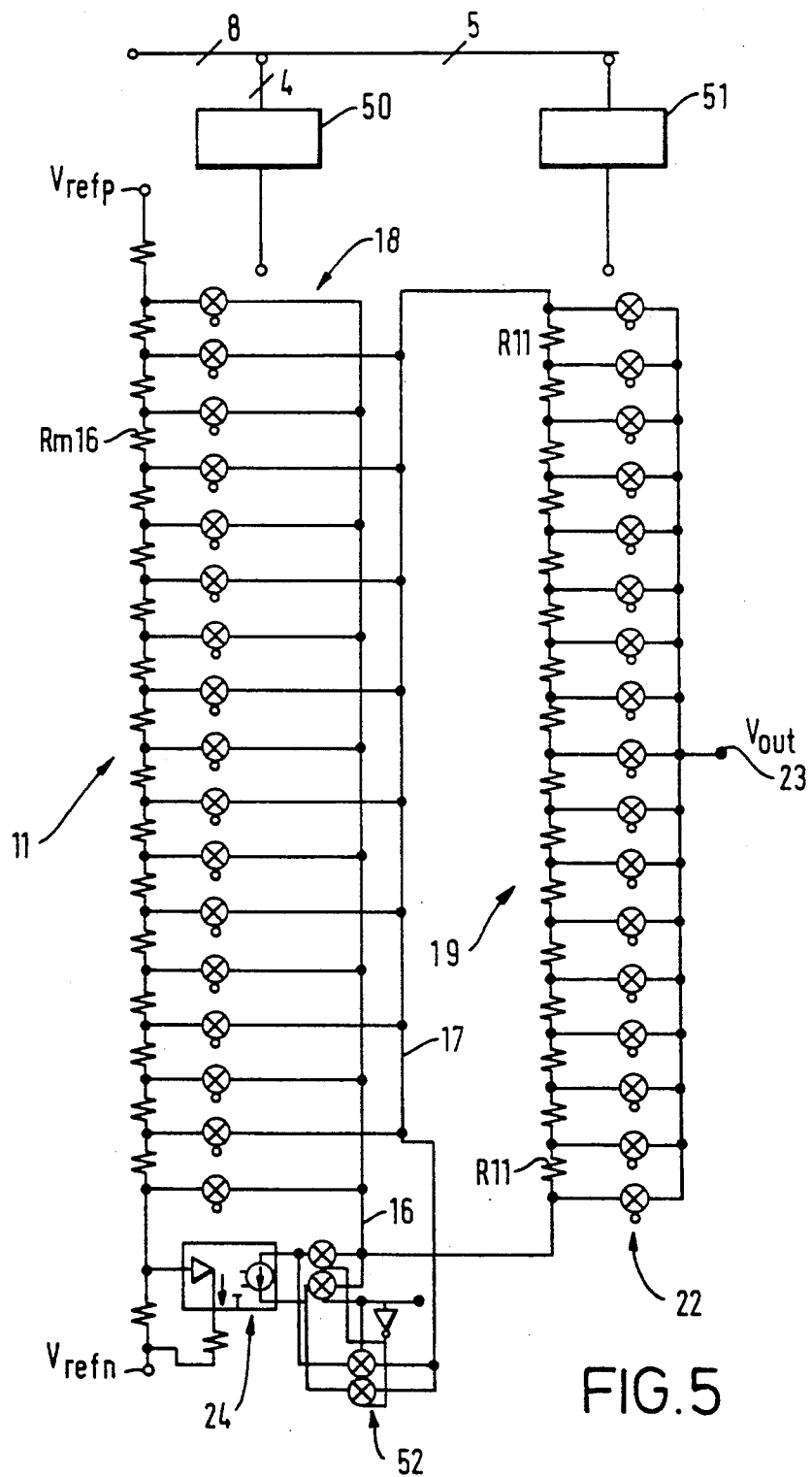
FIG. 5 illustrates an alternative embodiment of the invention.

FIG. 5 illustrates an embodiment of a digital-to-analog converter which is generally similar to that shown in FIG. 3 but differs in that there is only one switch between each node of the coarse divider and the respective line 16 or 17. This circuit operates generally in the manner previously described but it is necessary to provide different decoders 50 and 51 for the most significant and least significant bits and also for reversal of the polarity of the controlled current source relative to the lines 16 and 17. The latter is achieved by means of switches 52 controlled by the least significant (i4) of the top five bits.

Figure 6:
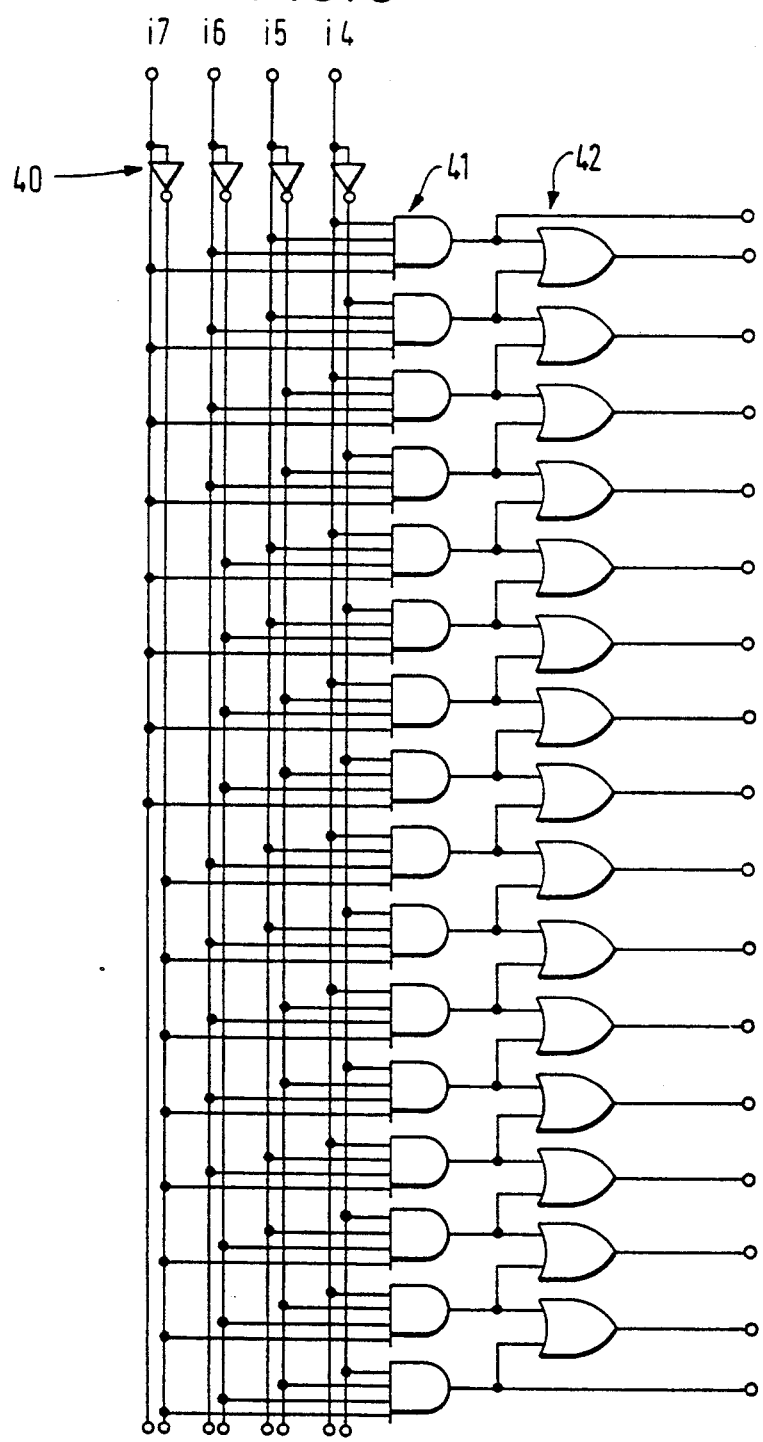
FIG. 6 illustrates a most significant bit decoder for use in the embodiment of FIG. 5.

FIG. 6 illustrates the most significant bit decoder 50. It comprises the bit lines, auxiliary bit lines, inverters 40 and AND gates 41 as previously described with reference to FIG. 4 but each AND gate is connected to one or two of the OR gates 42 so that when the output of an AND gate is active two adjacent output terminals are active so that always two consecutive switches 18 are closed, whereby two consecutive nodes of the coarse divider array are connected to the lines 16 and 17. This decoder requires seventeen outputs since there are seventeen switches 18 in FIG. 5.

Figure 7:
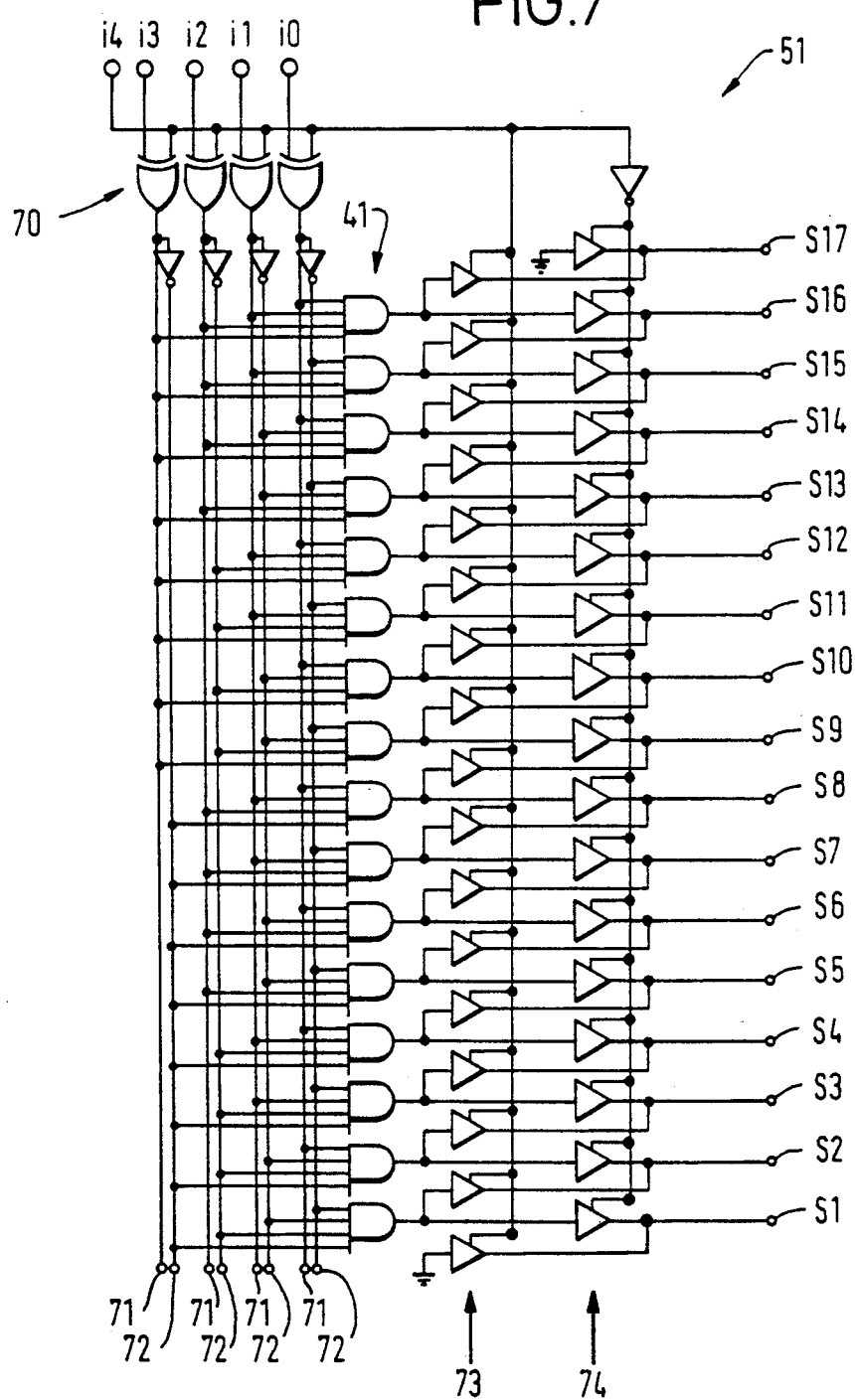
FIG. 7 illustrates a least significant bit decoder for use with the embodiment of FIG. 5.

The least significant bit decoder 51 is shown in FIG. 7. In addition to the bits i0 and i3 it has an additional input i4, which is the bit that controls the switches 52 in FIG. 5. This bit is combined in a respective one of four XOR gates 70 with a respective one of the bits i0 and i3.

The XOR gates feed the bit lines 71 and by way of a respective one of the inverters 40 the auxiliary bit lines 72. The lines 71 and 72 are coupled to the AND gates 41 in a manner similar to the arrangement shown in FIG. 5. The AND gates are connected to the terminals S1 to S17 by way of two sets 73 and 74 of inverters controlled by the bit i4 and its inverse respectively. This provides for the top to bottom switching of the fine divider as described in broad outline in the Post et al. reference.

Figure 8:
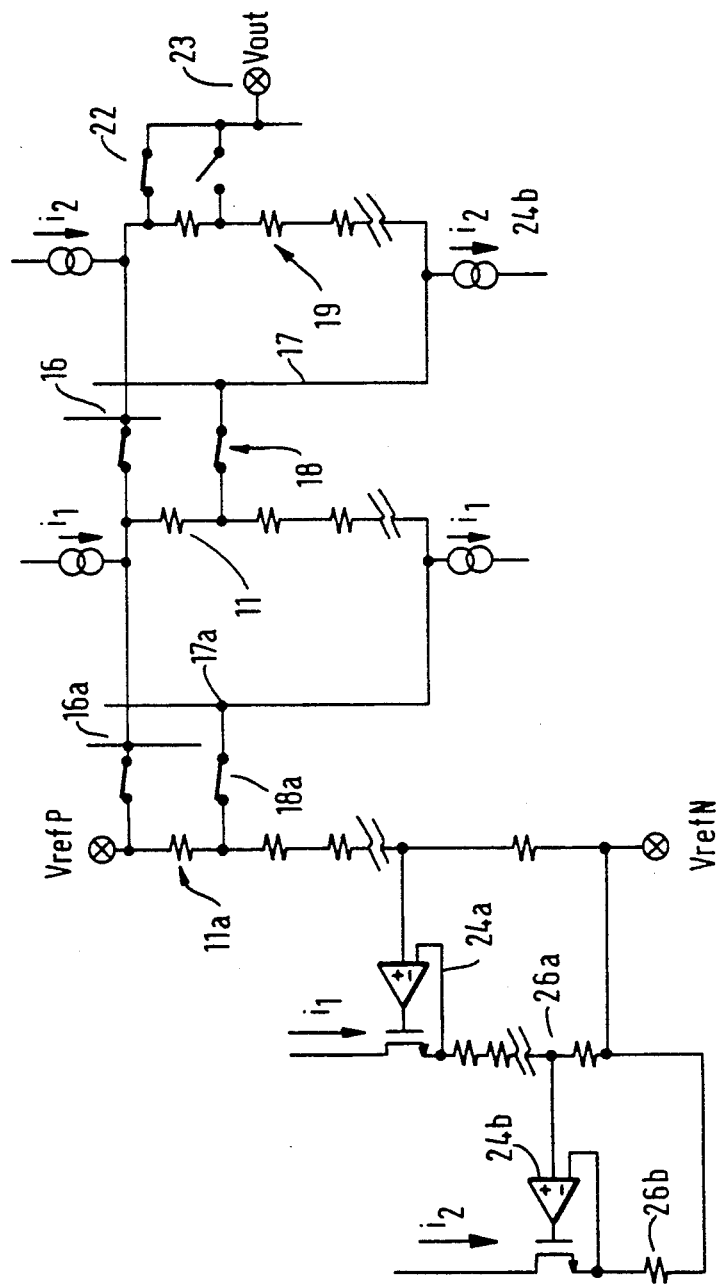
FIG. 8 illustrates schematically a cascade of three resistive dividers.

FIG. 8 illustrates an arrangement in which a divider 11 is cascaded with a divider 19 as previously described but is an intermediate divider in a cascade of three dividers including a first divider 11a connected by way of lines 16a and 17a to the divider 11. A controlled current generator 24a provides a current $i_1$ corresponding to the current through divider 11 and a further current generator 24b, which has a voltage input from across part of the resistor 26a, of which the resistance is equal to the total resistance of the intermediate divider. The generator 24b develops a current $i_2$ across a resistor 26b which corresponds to the total resistance of the final divider 19. The currents $i_1$ and $i_2$ may be coupled in parallel with the dividers 11 and 19 by respective current mirrors in the manner described with reference to FIG. 2.

In the foregoing, the invention has been described in detail with reference to a digital-to-analog converter. However, the structure shown in FIG. 1 and FIG. 2 can be used to provide an analog-to-digital converter in which coarse and fine ladders are employed in the same way. Different hardware, namely comparators and control logic, may be added to provide for comparison of an input voltage with the voltages at the nodes of coarse divider and the fine divider to provide a two-stage converter, which may in other respects be arranged according to the system described by Dingwall (op. cit.).

It will be understood that many variations and modifications may be made to the foregoing and the invention is therefore intended to be defined by the spirit and scope of the claims that follow.

I claim:

1. In a converter for converting signals between analog and digital form, a segmented voltage divider network comprising:
   a first resistive voltage divider for providing a multiplicity of substantially equal voltage segments;
   a second resistive voltage divider;
   means for directly connecting one of said voltage segments to said second voltage divider so tat said second divider constitutes a load on the first divider; and
   a controlled current source means coupled in parallel with said second divider for providing a compensatory current corresponding to that flowing through said second divider.

2. In a converter for converting signals between analog and digital form, a segmented voltage divider network comprising:
   a first resistive voltage divider for providing a multiplicity of substantially equal voltage segments;
   a second resistive voltage divider;
   means for directly connecting one of said voltage segments to said second voltage divider; and
   a controlled current source means coupled in parallel with said second divider for providing a compensatory current corresponding to that flowing through said second divider, said controlled current source means comprising means for providing a current flow through a first resistor, means for comparing a voltage developed across said first resistor by said current flow with a voltage corresponding to at least one of said voltage segments and for adjusting said current flow so as to bring said voltages into correspondence, and means for coupling said current flow in parallel with said divider.

3. The combination set forth in claim 2 wherein said means for comparing comprises an operational amplifier having a first input coupled to a node of said first divider and a second input to a second node thereof and controlled current switch means coupled in series with said resistor and having a control terminal coupled to an output of said amplifier.

4. The combination set forth in claim 3 further comprising at least one current mirror for coupling said current flow in parallel with said second divider.

5. A digital-to-analog converter for the conversion of a digital signal to corresponding analog form, comprising:

a first resistive voltage divider for providing a multiplicity of substantially equal voltage segments;

a second resistive voltage divider having a plurality of nodes;

means responsive to more significant bits of said digital signal for coupling a selective voltage segment across said second divider;

means responsive to less significant bits of said digital signal for selecting a node of said second divider; and controlled current source means coupled in parallel with said second divider to provide compensation for current flowing through said second voltage divider from said first divider.

6. In a converter for converting signals between a digital form and an analog form, the combination comprising:

a first resistive voltage divider comprising a chain of substantially equal resistors defining a first plurality of nodes therebetween;

a second resistive voltage divider comprising a chain of resistors defining a second plurality of nodes therebetween;

a first connecting line and a second connecting line, said second resistive voltage divider being connected said first connecting line and said second connecting line;

means for coupling a pair of consecutive nodes of said first resistor divider to the first connecting line and the second connecting line respectively;

a controlled current source connected to at least one of said connecting lines for providing a current compensating current flowing through said second resistive divider.

7. The combination set forth in claim 6 wherein said controlled current source comprises:

means for providing a current through a resistance means so as to develop a first voltage;

means for comparing a voltage between nodes of said first resistive voltage divider with said first voltage and for controlling said current to provide correspondence between said first and second voltages; and means for coupling the controlled current to said connecting lines.

8. The combination set forth in claim 6 wherein the means for coupling comprises a first array of switches between the nodes of said first resistive divider and said connecting lines; and said combination further comprises:

a second array of switches for selecting nodes of the second resistive array;

means for providing a digital word;

means responsive to more significant bits of said digital word for controlling the first array of switches; and means responsive to less significant bits of said digital word for controlling said second array of switches.

* * * * *